United States Patent
Wu et al.

(10) Patent No.: US 12,513,916 B2
(45) Date of Patent: Dec. 30, 2025

(54) SEMICONDUCTOR STRUCTURE AND MANUFACTURING METHOD THEREFOR

(71) Applicant: CHANGXIN MEMORY TECHNOLOGIES, INC., Hefei (CN)

(72) Inventors: Gongyi Wu, Hefei (CN); Yachao Xu, Hefei (CN); Xinran Liu, Hefei (CN); Juncai Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 437 days.

(21) Appl. No.: 18/165,384

(22) Filed: Feb. 7, 2023

(65) Prior Publication Data

US 2023/0282687 A1 Sep. 7, 2023

(30) Foreign Application Priority Data

Mar. 7, 2022 (CN) .......................... 202210216031.5

(51) Int. Cl.
  *H10D 1/00* (2025.01)
  *H10B 12/00* (2023.01)
  *H10D 1/68* (2025.01)

(52) U.S. Cl.
  CPC ............. *H10D 1/043* (2025.01); *H10B 12/03* (2023.02); *H10B 12/033* (2023.02); *H10B 12/31* (2023.02); *H10B 12/315* (2023.02); *H10B 12/318* (2023.02); *H10D 1/042* (2025.01); *H10D 1/696* (2025.01); *H10D 1/714* (2025.01); *H10D 1/716* (2025.01)

(58) Field of Classification Search
  CPC ........ H10D 1/696; H10D 1/716; H10D 1/692; H10D 1/714; H10D 1/042; H10D 1/043; H10B 12/318; H10B 12/033; H10B 12/03; H10B 12/315
  See application file for complete search history.

(56) References Cited

U.S. PATENT DOCUMENTS 5,192,703 A * 3/1993 Lee ...................... H10B 12/033
                                                              257/E21.648
6,127,220 A * 10/2000 Lange .................. H10B 12/033
                                                              438/254

FOREIGN PATENT DOCUMENTS

CN          110504283 A     11/2019

* cited by examiner

*Primary Examiner* — Jose R Diaz
(74) *Attorney, Agent, or Firm* — Syncoda LLC; Feng Ma

(57) ABSTRACT

A semiconductor structure and a manufacturing method therefor are provided. The semiconductor structure includes: a substrate; a plurality of connection pads disposed on a surface of the substrate; and a plurality of electrode pillars, disposed on the substrate and connected to the plurality of connection pads in a one-to-one correspondence. Each electrode pillar includes a first conductor layer and a second conductor layer that are alternately distributed in a direction perpendicular to the substrate. A material of the first conductor layer is different from a material of the second conductor layer. A side surface of the first conductor layer is recessed inward relative to a side surface of the second conductor layer.

20 Claims, 5 Drawing Sheets

SEMICONDUCTOR STRUCTURE AND MANUFACTURING METHOD THEREFOR

CROSS-REFERENCE TO RELATED APPLICATION

The present disclosure claims priority to Chinese Patent Application No. 202210216031.5, filed to the China National Intellectual Property Administration on Mar. 7, 2022 and entitled "SEMICONDUCTOR STRUCTURE AND MANUFACTURING METHOD THEREFOR", the disclosure of which is hereby incorporated by reference in its entirety.

BACKGROUND

A memory, such as a Dynamic Random Access Memory (DRAM), includes a capacitor structure used for storing charges. With the miniaturizing of a size of the capacitor structure, a conventional double-sided capacitor will develop to a columnar single-sided capacitor. However, the columnar single-sided capacitor has the problems that the surface area is small and charge storage is low.

SUMMARY

An embodiment of the disclosure provides a semiconductor structure. The semiconductor structure includes a substrate, a plurality of connection pads and a plurality of electrode pillars. The plurality of connection pads are disposed on a surface of the substrate. The plurality of electrode pillars are disposed on the substrate and connected to the plurality of connection pads in a one-to-one correspondence. Each electrode pillar includes a first conductor layer and a second conductor layer that are alternately distributed in a direction perpendicular to the substrate. A material of the first conductor layer is different from a material of the second conductor layer. A side surface of the first conductor layer is recessed inward relative to a side surface of the second conductor layer.

An embodiment of the disclosure further provides a method for manufacturing a semiconductor structure. The method includes the following operations. A substrate is provided, and a surface of the substrate includes a plurality of connection pads. A first conductor material layer and a second conductor material layer are alternately deposited in a direction perpendicular to the substrate. A material of the first conductor material layer is different from a material of the second conductor material layer. The first conductor material layer and the second conductor material layer are etched to form a first conductor layer and a second conductor layer. The first conductor layer and the second conductor layer form a plurality of electrode pillars. The plurality of electrode pillars are connected to a plurality of connection pads in a one-to-one correspondence. A side surface of the first conductor layer in each electrode pillar is recessed inward relative to a side surface of the second conductor layer.

The details of one or more embodiments of the disclosure are set forth in the drawings and the description below. Other features and advantages of the disclosure will be apparent from the drawings and the claims from the specification.

BRIEF DESCRIPTION OF THE DRAWINGS

In order to more clearly illustrate the technical solutions in the embodiments of the disclosure, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

Figure 1:
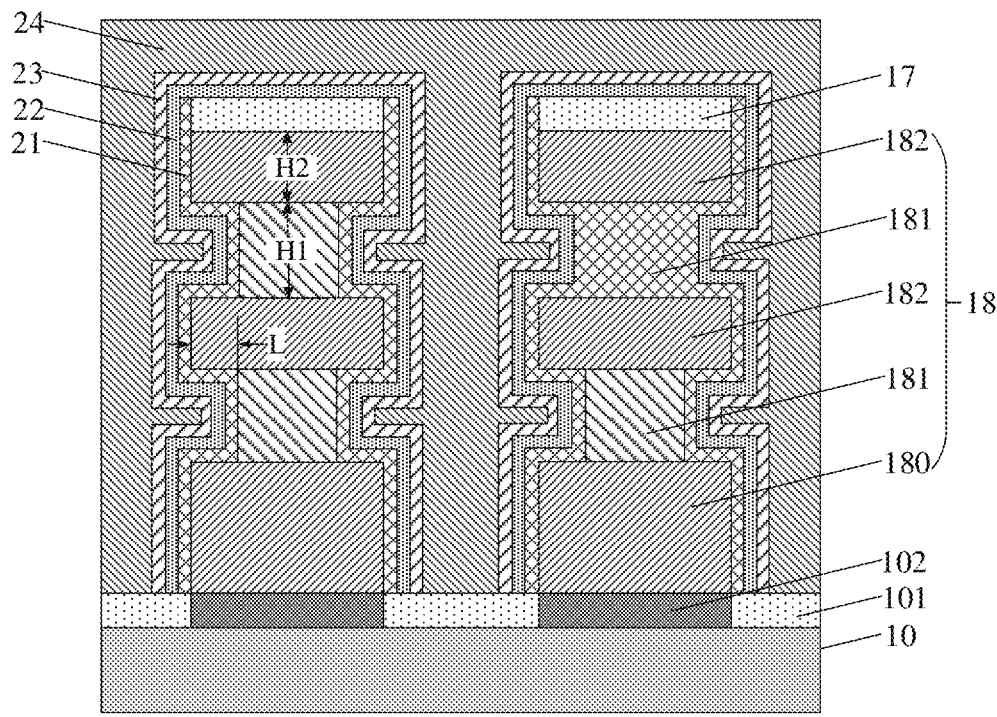
FIG. 1 is a schematic diagram of a semiconductor structure according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

A memory, such as a Dynamic Random Access Memory (DRAM), includes a capacitor structure. The capacitor structure stores data in the form of storing charges. Since the capacitor structure slowly discharges in an operating state, the capacitor structure is required to be recharged every a period of time. With the miniaturizing of a size of the capacitor structure, a conventional double-sided capacitor will develop to a columnar single-sided capacitor. However, the columnar single-sided capacitor has the problems of being small in surface area, low in charge storage and small in recharging time interval.

In view of the above, the following technical solutions of the embodiments of the disclosure are provided.

An embodiment of the disclosure provides a semiconductor structure, including: a substrate; a plurality of connection pads disposed on a surface of the substrate; and a plurality of electrode pillars, disposed on the substrate and connected to the plurality of connection pads in a one-to-one correspondence. Each electrode pillar includes a first conductor layer and a second conductor layer that are alternately distributed in a direction perpendicular to the substrate. A material of the first conductor layer is different from a material of the second conductor layer. A side surface of the first conductor layer is recessed inward relative to a side surface of the second conductor layer.

The electrode pillar provided in the embodiments of the disclosure includes the first conductor layer and the second conductor layer. The side surface of the first conductor layer is recessed inward relative to the side surface of the second conductor layer. Therefore, the surface area of the electrode pillar is increased, thereby improving the charge storage of the electrode pillar.

The semiconductor structure provided in this embodiment of the disclosure may be a DRAM, especially a DRAM of a storage unit having a 4F2 unit area. But it is not limited herein. The semiconductor structure may alternatively be any semiconductor structure having a capacitor.

Specific implementations of the disclosure are described below in detail with reference to the drawings. While the embodiments of the disclosure are described in detail, for ease of descriptions, a schematic diagram may not be partially enlarged according to a general scale, and the schematic diagram is only an example, it should not limit a scope of protection of the disclosure herein.

FIG. 1 is a schematic diagram of a semiconductor structure according to an embodiment of the disclosure. The semiconductor structure provided in the embodiments of the disclosure is further described in detail below with reference to FIG. 1.

As shown in the figure, the semiconductor structure includes: a substrate 10; a plurality of connection pads 102 disposed on a surface of the substrate 10; and a plurality of electrode pillars 18, disposed on the substrate 10 and connected to the plurality of connection pads 102 in a one-to-one correspondence. Each electrode pillar 18 includes a first conductor layer 181 and a second conductor layer 182 that are alternately distributed in a direction perpendicular to the substrate 10. A material of the first conductor layer 181 is different from a material of the second conductor layer 182. A side surface of the first conductor layer 181 is recessed inward relative to a side surface of the second conductor layer 182.

The substrate may be a semiconductor substrate, and may include at least one of an elementary semiconductor material (for example, a silicon (Si) substrate, or a germanium (Ge) substrate), at least one of a III-V compound semiconductor material, at least one of a II-VI compound semiconductor material, at least one of an organic semiconductor material, or other semiconductor materials known in the art. In some embodiments, the substrate may have structures such as a word line, a bit line, an active area, an isolation structure, and a contact layer. In a specific embodiment, the substrate is the Si substrate. The Si substrate may or may not be doped.

As shown in the figure, the substrate 10 further includes an interlayer insulation layer 101 disposed on the surface. The plurality of connection pads 102 are spaced apart from each other by the interlayer insulation layer 101. An upper surface of the connection pad 102 is flush with an upper surface of the interlayer insulation layer 101. The connection pads 102 may be arranged in a square or hexagonal manner on the substrate 10. The electrode pillars 18 and the connection pads 102 have the same arrangement mode. A material of the connection pad 102 includes one or more of tungsten (W), copper (Cu), titanium (Ti), tantalum (Ta), titanium nitride (TiN), tantalum nitride (TaN), metal silicides, or metal alloys, for example, the W. A material of the interlayer insulation layer 101 may be a nitride, such as silicon nitride.

Cross sections of the first conductor layer 181 and the second conductor layer 182 may be circular. But it is not limited herein. The cross sections of the first conductor layer 181 and the second conductor layer 182 may also be in other shapes such as a rectangle.

In some embodiments, a material of the first conductor layer 181 includes silicon germanium; and a material of the second conductor layer 182 includes polysilicon. The silicon germanium and the polysilicon may be doped or undoped. In this embodiment of the disclosure, the silicon germanium is used as the material of the first conductor layer 181, so that electric leakage can be effectively reduced, and the charge storage capability of the electrode pillar 18 can be improved.

In an embodiment, the side surface of the first conductor layer 181 is recessed inward by a preset length L relative to the side surface of the second conductor layer 182. The preset length L should not be too small or too large. If the preset length L is too small, the increasing of the side surface area of the electrode pillar 18 is not obvious; and if the preset length L is too large, the first conductor layer is difficult to support the electrode pillar 18, so that the stability of the electrode pillar 18 is poor. In an embodiment, a ratio of the preset length L to a size of the second conductor layer 182 parallel to a direction of the recess ranges from 2.5% to 25%, for example, from 5% to 10% or from 10% to 20%.

In an embodiment, the electrode pillar 18 further includes an initial conductor layer 180 disposed at the bottom layer. The initial conductor layer 180 is in contact with the connection pad 102, and a ratio of a thickness of the initial conductor layer 180 to a thickness of the electrode pillar 18 ranges from 0.2 to 0.6. The side surface of the first conductor layer 181 is recessed inward relative to a side surface of the initial conductor layer 180. A material of the initial conductor layer 180 includes polysilicon. That is to say, the thickness of the initial conductor layer 180 at the bottom layer is relatively large, and the side surface of the initial conductor layer 180 is protruded outward relative to the side surface of the first conductor layer 181, so that the stability of the electrode pillar 18 can be further enhanced without extra disposing a support structure. In some embodiments, the side surface of the initial conductor layer 180 is aligned with the side surface of the second conductor layer 182 in the direction perpendicular to the substrate 10. In a specific embodiment, the materials of the initial conductor layer 180 and the second conductor layer 182 are polysilicon, and the polysilicon may be doped or undoped.

As shown in the figure, in some embodiments, a width of the connection pad 102 is the same as a width of the initial conductor layer 180. But it is not limited herein. The width of the connection pad 102 may also be greater than or less than the width of the initial conductor layer 180.

In an embodiment, on the initial conductor layer 180, the electrode pillar 18 includes n first conductor layers 181 and n second conductor layers 182, where n is a positive integer from 1 to 50. As shown in the figure, an upper surface of the initial conductor layer 180 is in contact with the first conductor layer 181. In some embodiments, each of the n first conductor layers 181 has a first thickness H1; and each of the n second conductor layers 182 has a second thickness H2. A ratio of the first thickness H1 to the second thickness H2 should not be too large. If the ratio is too large, the stability of the electrode pillar 18 is reduced. The ratio of the first thickness H1 to the second thickness H2 should not be too small. If the ratio is too small, the effect of the first conductor layer 181 to reduce electric leakage is reduced. In some embodiments, the ratio of the first thickness H1 to the second thickness H2 ranges from 1 to 2. More specifically, a sum of the first thickness H1 and the second thickness H2 is between 10 and 100 nanometers.

As shown in the figure, in some embodiments, the semiconductor structure further includes an insulation layer 17. The insulation layer 17 is disposed on an upper surface of the electrode pillar 18. More specifically, the top layer of the electrode pillar 18 is the second conductor layer 182. The insulation layer 17 covers an upper surface of the second conductor layer 182. The insulation layer 17 may be made of a nitride, such as silicon nitride.

In an embodiment, the semiconductor structure further includes a lower electrode layer 21. The lower electrode layer 21 covers a side surface of the electrode pillar 18. As shown in the figure, the lower electrode layer 21 may also cover a side surface of the insulation layer 17. A material of the lower electrode layer 21 includes one or more of W, Cu, Ti, Ta, TiN, TaN, metal silicides, or metal alloys, for example, the TiN.

In an embodiment, the semiconductor structure further includes a dielectric layer 22. The dielectric layer 22 covers at least a surface of the lower electrode layer 21. As shown in the figure, the dielectric layer 22 also covers an upper surface of the insulation layer 17. A material of the dielectric layer 22 may be a high dielectric constant material, for example, may be tantalum oxide, hafnium oxide, zirconium oxide, niobium oxide, titanium oxide, barium oxide, strontium oxide, yttrium oxide, lanthanum oxide, praseodymium oxide, or barium strontium titanate.

In some embodiments, the semiconductor structure further includes an upper electrode layer 23. The upper electrode layer 23 covers a surface of the dielectric layer 22. A material of the upper electrode layer 23 includes one or more of W, Cu, Ti, Ta, TiN, TaN, metal silicides, or metal alloys, for example, the TiN.

In some embodiments, the semiconductor structure further includes a filling layer 24. The filling layer 24 is disposed above the plurality of electrode pillars 18 and among the plurality of electrode pillars 18, and is in contact with the upper electrode layer 23. A material of the filling layer 24 may be a conductive material such as silicon, silicon germanium, polysilicon, doped silicon, silicide, and the like or a combination thereof, for example, the silicon germanium.

The electrode pillar 18, the lower electrode layer 21, the dielectric layer 22, the upper electrode layer 23 and the filling layer 24 form a capacitor structure used for storing charges. In the embodiments of the disclosure, the side surface of the first conductor layer 181 is recessed inward relative to the side surface of the second conductor layer 182. Therefore, the surface area of the electrode pillar 18 can be increased, the charge storage of the electrode pillar 18 can be increased, and the surface areas of the lower electrode layer 21 and the upper electrode layer 23 are also increased, thereby increasing the charge storage of the capacitor structure, prolonging the recharging time interval of the capacitor structure, and improving the performance of the semiconductor structure.

Figure 2:
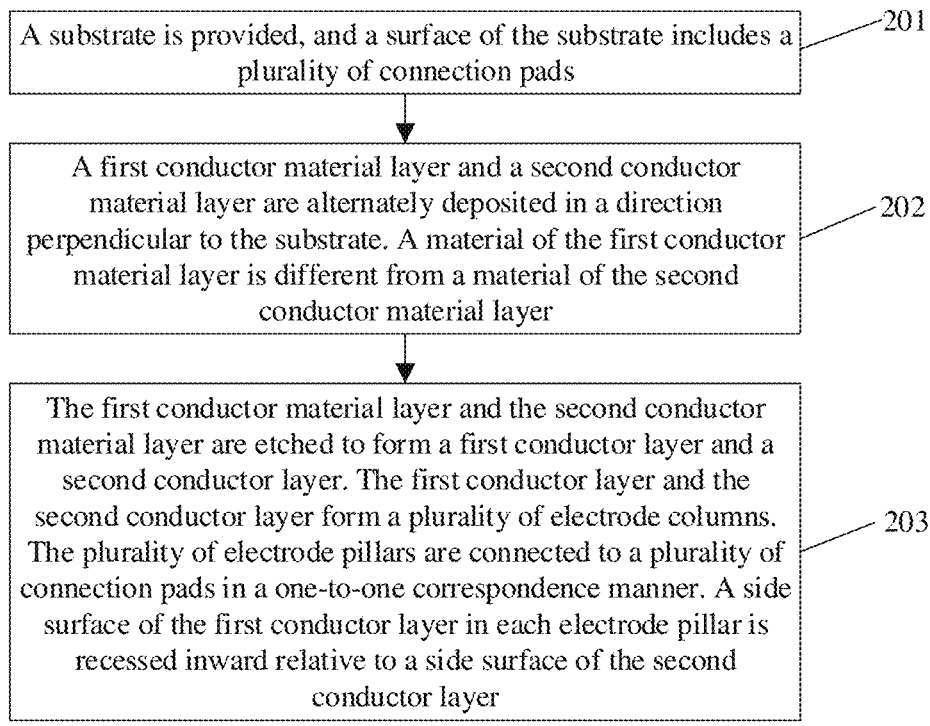
FIG. 2 is a block flowchart of a method for manufacturing a semiconductor device according to an embodiment of the disclosure.

An embodiment of the disclosure further provides a method for manufacturing a semiconductor structure. As shown in FIG. 2, the method includes the following steps.

At S201, a substrate is provided, and a surface of the substrate includes a plurality of connection pads.

At S202, a first conductor material layer and a second conductor material layer are alternately deposited in a direction perpendicular to the substrate. A material of the first conductor material layer is different from a material of the second conductor material layer.

At S203, the first conductor material layer and the second conductor material layer are etched to form a first conductor layer and a second conductor layer. The first conductor layer and the second conductor layer form a plurality of electrode pillars. The plurality of electrode pillars are connected to a plurality of connection pads in a one-to-one correspondence. A side surface of the first conductor layer in each electrode pillar is recessed inward relative to a side surface of the second conductor layer.

The method for manufacturing a semiconductor structure provided in the embodiments of the disclosure is further described in detail below with reference to FIGS. 3 to 10.

Figure 3:
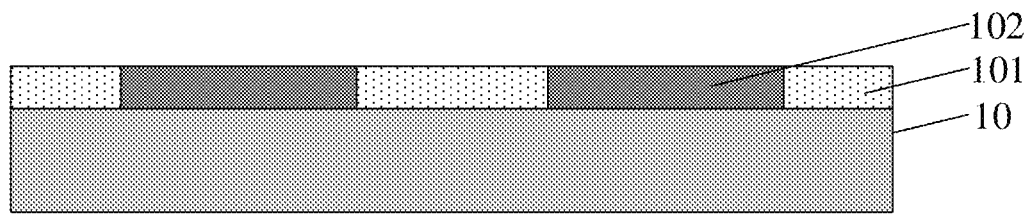
FIGS. 3 to 10 are process flow diagrams of a semiconductor structure according to embodiments of the disclosure.

Firstly, S201 is performed. As shown in FIG. 3, the substrate 10 is provided, and a surface of the substrate 10 includes the plurality of connection pads 102.

The substrate may be a semiconductor substrate, and may include at least one of an elementary semiconductor material (for example, a silicon (Si) substrate, or a germanium (Ge) substrate), at least one of a III-V compound semiconductor material, at least one of a II-VI compound semiconductor material, at least one of an organic semiconductor material, or other semiconductor materials known in the art. In some embodiments, the substrate may have structures such as a word line, a bit line, an active area, an isolation structure, and a contact layer. In a specific embodiment, the substrate is the Si substrate. The Si substrate may or may not be doped.

As shown in the figure, the substrate 10 further includes an interlayer insulation layer 101 disposed on the surface. The plurality of connection pads 102 are spaced apart from each other by the interlayer insulation layer 101. An upper surface of the connection pad 102 is flush with an upper surface of the interlayer insulation layer 101. The connection pads 102 may be arranged in a square or hexagonal manner on the substrate 10. A material of the connection pad 102 includes one or more of W, Cu, Ti, Ta, TiN, TaN, metal silicides, or metal alloys, for example, the W. A material of the interlayer insulation layer 101 may be a nitride, such as silicon nitride.

Figure 4:
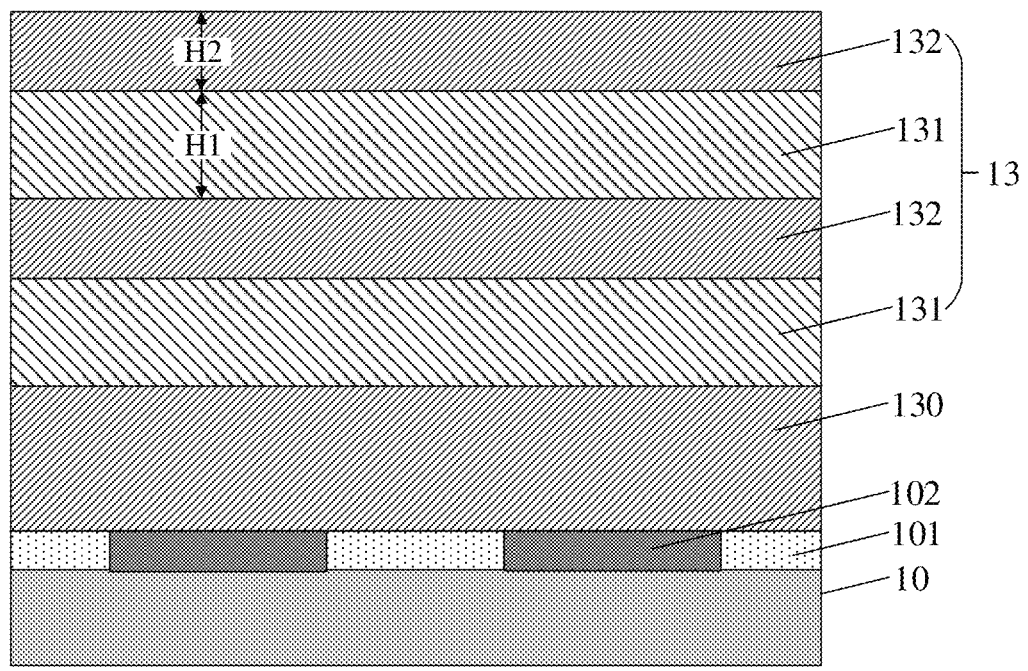

Furthermore, S202 is performed. As shown in FIG. 4, the first conductor material layer 131 and the second conductor material layer 132 are alternately deposited in the direction perpendicular to the substrate 10. The material of the first conductor material layer 131 is different from the material of the second conductor material layer 132.

Specifically, by means of one or more thin-film deposition processes, the first conductor material layer 131 and the second conductor material layer 132 are alternately deposited on the substrate 10. The first conductor material layer 131 and the second conductor material layer 132 form a stacked material layer 13. The thin-film deposition process includes, but is not limited to, a CVD process, a PECVD process, an ALD process, or a combination thereof.

In an embodiment, a material of the first conductor material layer 131 includes silicon germanium; and a material of the second conductor material layer 132 includes polysilicon. The silicon germanium and the polysilicon may be doped or undoped. Subsequently, the first conductor material layer 131 and the second conductor material layer 132 are etched to respectively form the first conductor layer 181 (referring to FIG. 7) and the second conductor layer 182 (referring to FIG. 7). The first conductor layer 181 and the second conductor layer 182 form a plurality of electrode pillars 18 (referring to FIG. 7). In this embodiment of the disclosure, the silicon germanium is used as the material of the first conductor material layer 131, so that electric leakage can be effectively reduced, and the charge storage capability of the electrode pillar 18 can be improved.

Referring to FIG. 4 again, in an embodiment, before the first conductor material layer 131 and the second conductor material layer 132 are alternately deposited in the direction perpendicular to the substrate 10, the method further includes: depositing an initial conductor material layer 130 on the substrate 10. A material of the initial conductor material layer 130 includes polysilicon. In a specific embodiment, materials of the initial conductor material layer 130 and the second conductor material layer 132 are both polysilicon.

In an embodiment, a ratio of a thickness of the initial conductor material layer 130 to a sum of thicknesses of the stacked material layer 13 and the initial conductor material layer 130 ranges from 0.2 to 0.6. That is to say, the thickness of the initial conductor layer 180 at the bottom layer is relatively large, so that the stability of the electrode pillar 18 (referring to FIG. 7) that is formed in the follow-up process steps can be enhanced without extra disposing a support structure.

In an embodiment, on the initial conductor material layer 130, the stacked material layer 13 includes n first conductor material layers 131 and n second conductor material layers 132, where n is a positive integer from 1 to 50. As shown in FIG. 4, the bottom layer of the stacked material layer 13 is the first conductor material layer 131, and an upper surface of the initial conductor material layer 130 is in contact with the first conductor material layer 131. In some embodiments, each of the n first conductor material layers 131 has a first thickness H1; and each of the n second conductor material layers 132 has a second thickness H2. A ratio of the first thickness H1 to the second thickness H2 should not be too large. If the ratio is too large, the stability of the electrode pillar 18 (referring to FIG. 7) that is formed in the follow-up processes is reduced. The ratio of the first thickness H1 to the second thickness H2 should not be too small. If the ratio is too small, the effect of the first conductor layer 181 (referring to FIG. 7) that is formed in the follow-up processes to reduce electric leakage is reduced. In some embodiments, the ratio of the first thickness H1 to the second thickness H2 ranges from 1 to 2. More specifically, a sum of the first thickness H1 and the second thickness H2 is between 10 and 100 nanometers.

Figure 6:
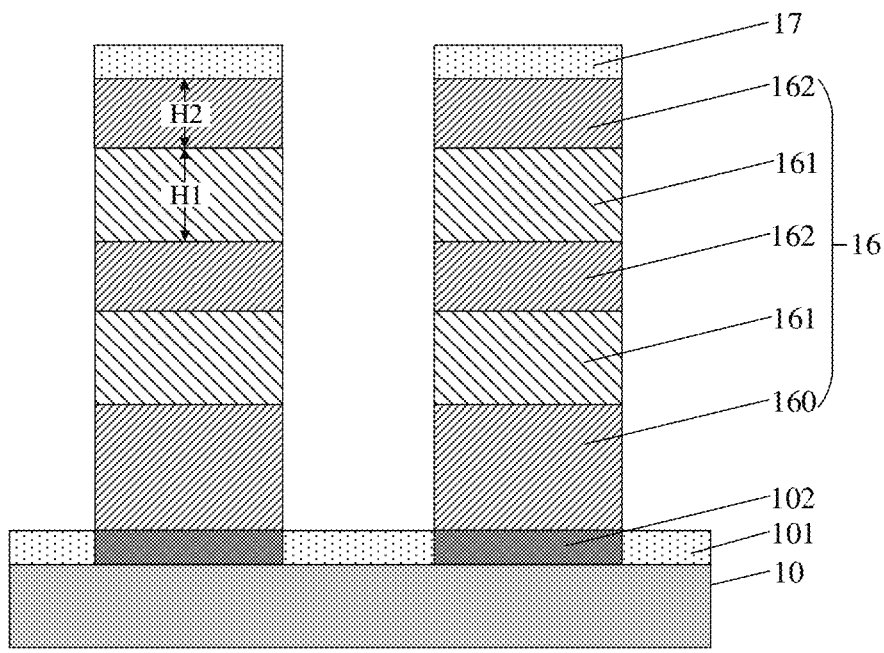
Figure 7:
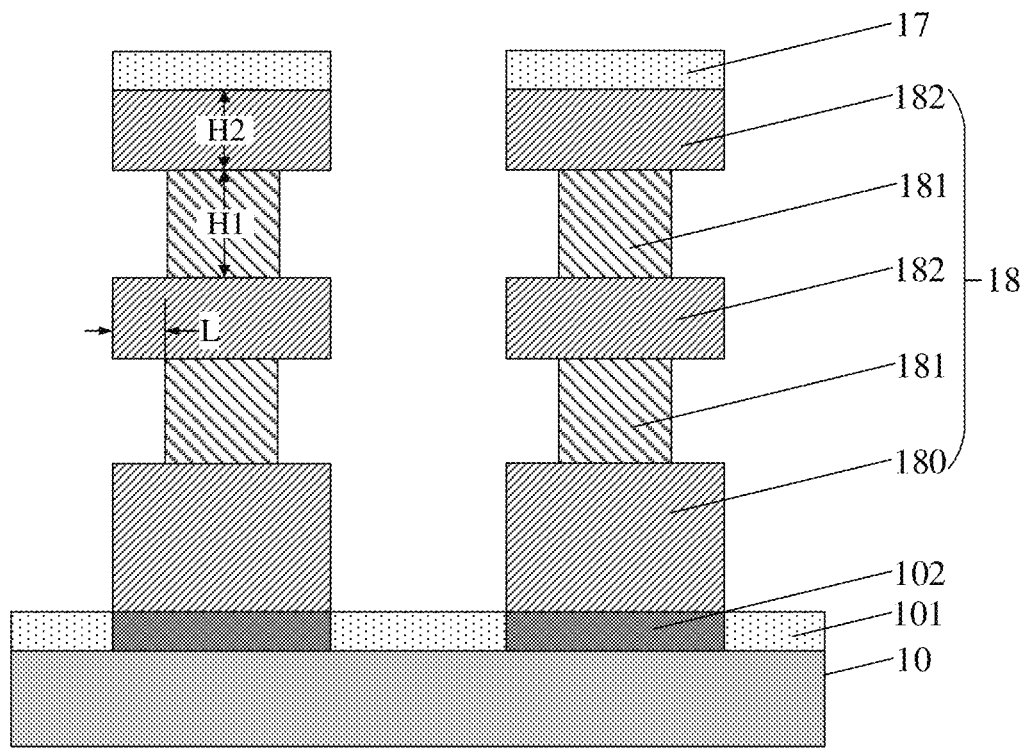

Furthermore, S203 is performed. As shown in FIG. 6 to FIG. 7, the first conductor material layer 131 and the second conductor material layer 132 are etched to form a first conductor layer 181 and a second conductor layer 182. The first conductor layer 181 and the second conductor layer 182 form a plurality of electrode pillars 18. The plurality of electrode pillars 18 are connected to a plurality of connection pads 102 in a one-to-one correspondence. A side surface of the first conductor layer 181 in each electrode pillar 18 is recessed inward relative to a side surface of the second conductor layer 182.

Referring to FIGS. 6 to 7 again, in an embodiment, while the first conductor material layer 131 and the second conductor material layer 132 are etched to form the first conductor layer 181 and the second conductor layer 182, the method further includes: etching the initial conductor material layer 130 to form the initial conductor layer 180. The initial conductor layer 180, the first conductor layer 181 and the second conductor layer 182 form the plurality of electrode pillars 18.

Specifically, the operation of forming the plurality of electrode pillars 18 includes: etching the first conductor material layer 131, the second conductor material layer 132 and the initial conductor material layer 130 from top to bottom until the surface of the substrate 10 is exposed, so as to form a first conductor intermediate layer 161, a second conductor intermediate layer 162 and an initial conductor intermediate layer 160. As shown in FIG. 6, the first conductor intermediate layer 161, the second conductor intermediate layer 162 and the initial conductor intermediate layer 160 form a plurality of initial electrode pillars 16. A side surface of the first conductor intermediate layer 161 in each initial electrode pillar 16, a side surface of the second conductor intermediate layer 162 and a side surface of the initial conductor intermediate layer 163 are aligned in a direction perpendicular to the substrate 10.

The first conductor intermediate layer 161, the second conductor intermediate layer 162 and the initial conductor intermediate layer 160 are laterally etched, so as to form the first conductor layer 181, the second conductor layer 182 and the initial conductor layer 180. The first conductor layer 181, the second conductor layer 182 and the initial conductor layer 180 form the plurality of electrode pillars 18. The side surface of the first conductor layer 181 in each electrode pillar 18 is recessed inward relative to the side surface of the second conductor layer 182 and a side surface of the initial conductor layer 180.

In an embodiment, the first conductor intermediate layer 161, the second conductor intermediate layer 162 and the initial conductor intermediate layer 160 may be laterally etched by means of the dry etching process. The dry etching process may be a chemical gas etching process. Specifically, by controlling the flow of an etching gas that is introduced in a reaction chamber, an etching rate of a material of the first conductor intermediate layer 161 is greater than etching rates of the second conductor intermediate layer 162 and the initial conductor intermediate layer 160, so as to selectively etch the first conductor intermediate layer 161.

In an embodiment, the side surface of the first conductor layer 181 is recessed inward by a preset length L relative to the side surface of the second conductor layer 182. The preset length L should not be too small or too large. If the preset length L is too small, the increasing of the side surface area of the electrode pillar 18 is not obvious; and if the preset length L is too large, the first conductor layer is difficult to support the electrode pillar 18, so that the stability of the electrode pillar 18 is poor. In an embodiment, a ratio of the preset length L to a size of the second conductor layer 182 parallel to a direction of the recess ranges from 2.5% to 25%, for example, from 5% to 10% or from 10% to 20%.

In the embodiments of the disclosure, the initial conductor layer 180 with a large thickness is disposed at the bottom layer of the electrode pillar 18, and the side surface of the initial conductor layer 180 is protruded outward relative to the side surface of the first conductor layer 181, so that the stability of the electrode pillar 18 can be further enhanced without extra disposing a support structure. In some embodiments, the side surface of the initial conductor layer 180 is aligned with the side surface of the second conductor layer 182 in the direction perpendicular to the substrate 10.

Figure 5:
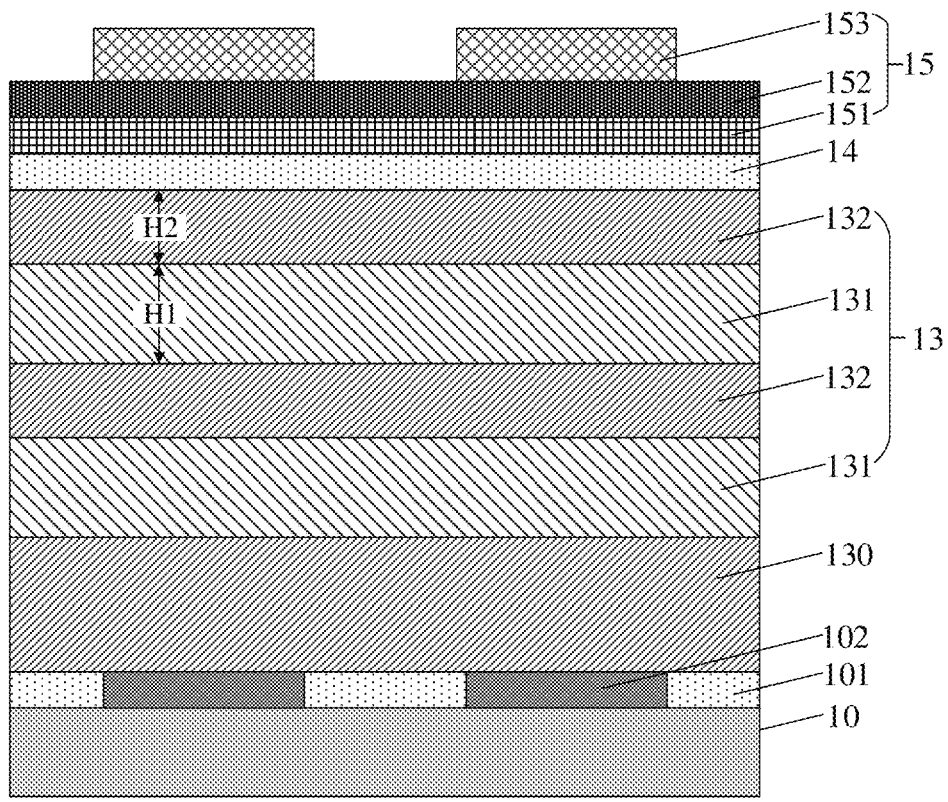

As shown in FIGS. 5 to 6, in some embodiments, a semiconductor structure further includes an insulation layer 17. Before the first conductor material layer 131 and the second conductor material layer 132 are etched, the method includes the following operations.

An insulation material layer 14 is formed on the stacked material layer 13 that is formed by the first conductor material layer 131 and the second conductor material layer 132. A material of the insulation material layer 14 may be a nitride, such as silicon nitride.

The insulation material layer 14 is etched to form the insulation layer 17.

Also referring to FIG. 5, the method further includes: forming a mask layer 15 on the insulation material layer 14. The mask layer 15 includes a first mask layer 151, a second mask layer 152 and a pattered mask layer 153 that are stacked from bottom to top. The insulation material layer 14, the first conductor material layer 131, the second conductor material layer 132 and the initial conductor material layer 130 are etched by using the mask layer 15 as an etching mask. Using a plurality of layers of masks is to improve the accuracy of pattern transfer. In an embodiment, a material of the first mask layer 151 and a material of the pattered mask layer 153 include silicon oxycarbide. The second mask layer 152 includes a silicon oxynitride layer.

Figure 8:
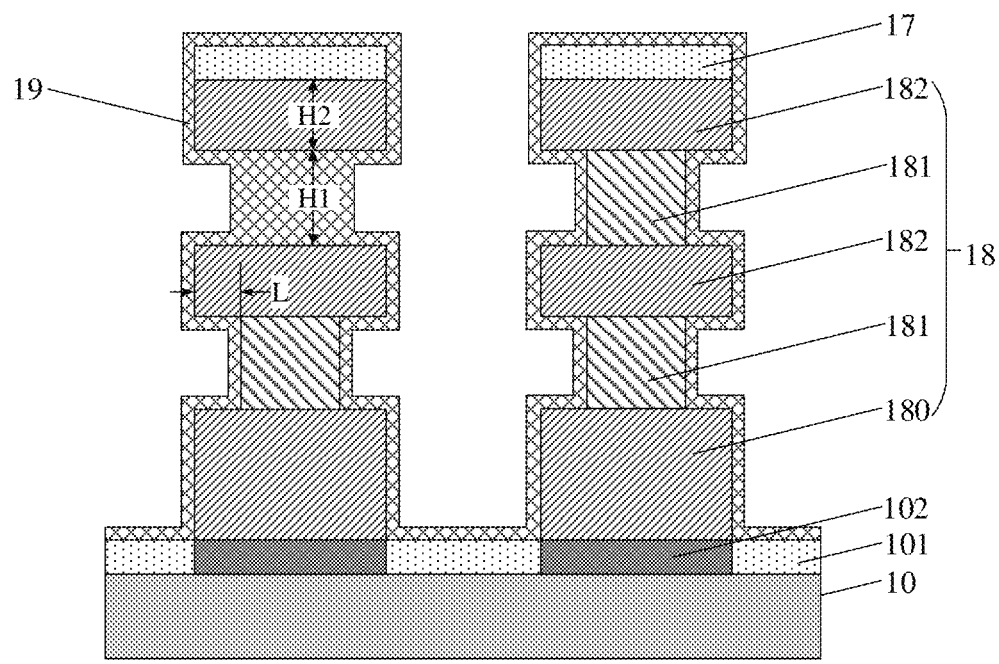
Figure 9:
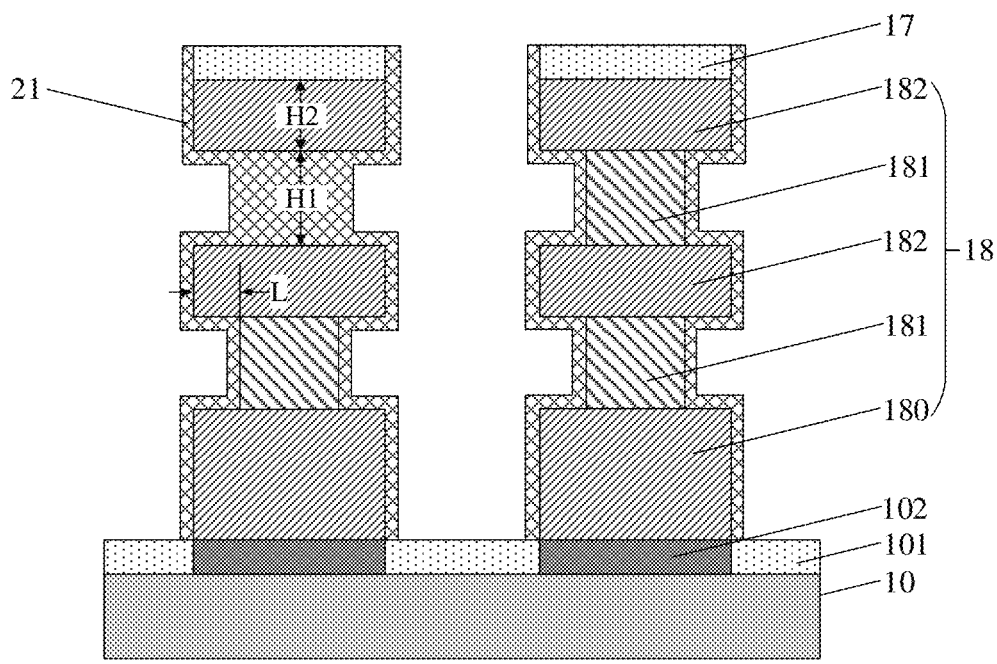

Furthermore, as shown in FIG. 8 to FIG. 9, after the plurality of electrode pillars 18 are formed, the method further includes the following operations.

A lower electrode material layer 19 is formed on the substrate 10. The lower electrode material layer 19 covers the plurality of electrode pillars 18 and a surface of the substrate 10 among the plurality of electrode pillars 18.

Part of the lower electrode material layer 19 is removed to form a lower electrode layer 21. The lower electrode layer 21 covers at least a side surface of each electrode pillar 18.

As shown in FIG. 9, the lower electrode layer 21 also covers a side surface of the insulation layer 17. A material of the lower electrode layer includes one or more of W, Cu, Ti, Ta, TiN, TaN, metal silicides, or metal alloys, for example, the TiN.

Figure 10:
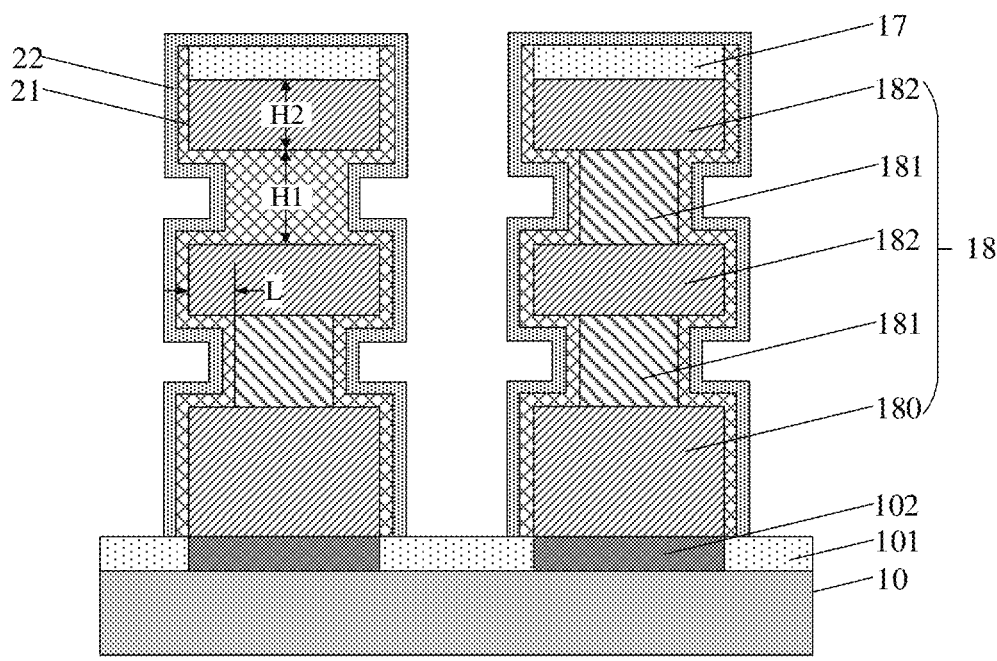

Furthermore, as shown in FIG. 10, the method further includes: forming a dielectric layer 22 on the substrate 10. The dielectric layer 22 covers at least a surface of the lower electrode layer 21. The dielectric layer 22 may also cover the upper surface of the insulation layer 17. A material of the dielectric layer 22 may be a high dielectric constant material, for example, may be tantalum oxide, hafnium oxide, zirconium oxide, niobium oxide, titanium oxide, barium oxide, strontium oxide, yttrium oxide, lanthanum oxide, praseodymium oxide, or barium strontium titanate. A material of the upper electrode layer 23 includes one or more of W, Cu, Ti, Ta, TiN, TaN, metal silicides, or metal alloys, for example, the TiN.

Furthermore, the method further includes: forming an upper electrode layer 23 on the dielectric layer 22; and forming a filling layer 24 on the upper electrode layer 23. The filling layer 24 is disposed above the plurality of electrode pillars 18 and among the plurality of electrode pillars 18, so as to finally form a structure shown in FIG. 1. A material of the upper electrode layer 23 includes one or more of W, Cu, Ti, Ta, TiN, TaN, metal silicides, or metal alloys, for example, the TiN. A material of the filling layer 24 may be a conductive material such as silicon, silicon germanium, polysilicon, doped silicon, silicide, and the like or a combination thereof, for example, the silicon germanium.

The electrode pillar 18, the lower electrode layer 21, the dielectric layer 22, the upper electrode layer 23 and the filling layer 24 form a capacitor structure used for storing charges. In the embodiments of the disclosure, the side surface of the first conductor layer 181 is recessed inward relative to the side surface of the second conductor layer 182. Therefore, the surface area of the electrode pillar 18 can be increased, the charge storage of the electrode pillar 18 can be increased, and the surface areas of the lower electrode layer 21 and the upper electrode layer 23 are also increased, thereby increasing the charge storage of the capacitor structure, prolonging the recharging time interval of the capacitor structure, and improving the performance of the semiconductor structure.

According to the semiconductor structure and the manufacturing method therefor provided in the embodiments of the disclosure, the semiconductor structure includes: a substrate; a plurality of connection pads disposed on a surface of the substrate; and a plurality of electrode pillars, disposed on the substrate and connected to the plurality of connection pads in a one-to-one correspondence. Each electrode pillar includes a first conductor layer and a second conductor layer that are alternately distributed in a direction perpendicular to the substrate. A material of the first conductor layer is different from a material of the second conductor layer. A side surface of the first conductor layer is recessed inward relative to a side surface of the second conductor layer. The electrode pillar provided in the embodiments of the disclosure includes the first conductor layer and the second conductor layer. The side surface of the first conductor layer is recessed inward relative to the side surface of the second conductor layer. Therefore, the surface area of the electrode pillar is increased, thereby improving the charge storage of the electrode pillar.

It is to be noted that, those skilled in the art can change the sequence of the above steps without departing from the protection scope of the disclosure. The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

The invention claimed is:

1. A semiconductor structure, comprising:
a substrate; a plurality of connection pads disposed on a surface of the substrate; and
a plurality of electrode pillars, disposed on the substrate and connected to the plurality of connection pads in a one-to-one correspondence, wherein each electrode pillar comprises a first conductor layer and a second conductor layer that are alternately distributed in a direction perpendicular to the substrate, a material of the first conductor layer is different from a material of the second conductor layer, and a side surface of the first conductor layer is recessed inward relative to a side surface of the second conductor layer;
wherein the side surface of the first conductor layer is recessed inward by a preset length relative to the side surface of the second conductor layer; and a ratio of the preset length to a size of the second conductor layer parallel to a direction of the recess ranges from 2.5% to 25%.

2. The semiconductor structure of claim 1, wherein a material of the first conductor layer comprises silicon germanium; and a material of the second conductor layer comprises polysilicon.

3. The semiconductor structure of claim 1, wherein the electrode pillar further comprises an initial conductor layer disposed at the bottom layer; the initial conductor layer is in contact with the connection pad, and a ratio of a thickness of the initial conductor layer to a thickness of the electrode pillar ranges from 0.2 to 0.6; the side surface of the first conductor layer is recessed inward relative to a side surface of the initial conductor layer; and a material of the initial conductor layer comprises polysilicon.

4. The semiconductor structure of claim 3, wherein the electrode pillar comprises n first conductor layers and n second conductor layers above the initial conductor layer, where n is a positive integer ranged from 1 to 50.

5. The semiconductor structure of claim 4, wherein each of the n first conductor layers has a first thickness; each of the n second conductor layers has a second thickness; and a ratio of the first thickness to the second thickness ranges from 1 to 2.

6. The semiconductor structure of claim 5, wherein a sum of the first thickness and the second thickness is between 10 and 100 nanometers.

7. The semiconductor structure of claim 1, further comprising an insulation layer disposed on an upper surface of the electrode pillar.

8. The semiconductor structure of claim 1, further comprising a lower electrode layer, which covers a side surface of the electrode pillar.

9. The semiconductor structure of claim 8, further comprising a dielectric layer, which covers at least a surface of the lower electrode layer.

10. The semiconductor structure of claim 9, further comprising an upper electrode layer, which covers a surface of the dielectric layer.

11. The semiconductor structure of claim 10, further comprising a filling layer which is disposed above the plurality of electrode pillars and between the plurality of electrode pillars, and is in contact with the upper electrode layer.

12. A semiconductor structure, comprising:
a substrate; a plurality of connection pads disposed on a surface of the substrate; and
a plurality of electrode pillars, disposed on the substrate and connected to the plurality of connection pads in a one-to-one correspondence, wherein each electrode pillar comprises a first conductor layer and a second conductor layer that are alternately distributed in a direction perpendicular to the substrate, a material of the first conductor layer is different from a material of the second conductor layer, and a side surface of the first conductor layer is recessed inward relative to a side surface of the second conductor layer;
wherein a material of the first conductor layer comprises silicon germanium; and a material of the second conductor layer comprises polysilicon.

13. The semiconductor structure of claim 12, wherein the electrode pillar further comprises an initial conductor layer disposed at the bottom layer; the initial conductor layer is in contact with the connection pad, and a ratio of a thickness of the initial conductor layer to a thickness of the electrode pillar ranges from 0.2 to 0.6; the side surface of the first conductor layer is recessed inward relative to a side surface of the initial conductor layer; and a material of the initial conductor layer comprises polysilicon.

14. The semiconductor structure of claim 13, wherein the electrode pillar comprises n first conductor layers and n second conductor layers above the initial conductor layer, where n is a positive integer ranged from 1 to 50.

15. The semiconductor structure of claim 14, wherein each of the n first conductor layers has a first thickness; each of the n second conductor layers has a second thickness; and a ratio of the first thickness to the second thickness ranges from 1 to 2.

16. The semiconductor structure of claim 15, wherein a sum of the first thickness and the second thickness is between 10 and 100 nanometers.

17. A semiconductor structure, comprising:
a substrate; a plurality of connection pads disposed on a surface of the substrate; and
a plurality of electrode pillars, disposed on the substrate and connected to the plurality of connection pads in a one-to-one correspondence, wherein each electrode pillar comprises a first conductor layer and a second conductor layer that are alternately distributed in a direction perpendicular to the substrate, a material of the first conductor layer is different from a material of the second conductor layer, and a side surface of the first conductor layer is recessed inward relative to a side surface of the second conductor layer;
wherein the electrode pillar further comprises an initial conductor layer disposed at the bottom layer; the initial conductor layer is in contact with the connection pad, and a ratio of a thickness of the initial conductor layer to a thickness of the electrode pillar ranges from 0.2 to 0.6; the side surface of the first conductor layer is recessed inward relative to a side surface of the initial conductor layer; and a material of the initial conductor layer comprises polysilicon.

18. The semiconductor structure of claim 17, wherein the electrode pillar comprises n first conductor layers and n second conductor layers above the initial conductor layer, where n is a positive integer ranged from 1 to 50.

19. The semiconductor structure of claim 18, wherein each of the n first conductor layers has a first thickness; each of the n second conductor layers has a second thickness; and a ratio of the first thickness to the second thickness ranges from 1 to 2.

20. The semiconductor structure of claim 19, wherein a sum of the first thickness and the second thickness is between 10 and 100 nanometers.

* * * * *